United States Patent [19]

Milberger et al.

[11] Patent Number: 4,897,617
[45] Date of Patent: Jan. 30, 1990

[54] DOMINO EFFECT AMPLIFIER

[75] Inventors: Walter E. Milberger, Severna Park; Franklin B. Jones, Catonsville; Charles S. Kerfoot, Pasadena, all of Md.

[73] Assignee: The United States of America as represented by the Secretary of the Air Force, Washington, D.C.

[21] Appl. No.: 318,211

[22] Filed: Feb. 28, 1989

[51] Int. Cl.$^4$ .............................................. H03F 3/16
[52] U.S. Cl. ................................... 330/277; 330/297; 330/310
[58] Field of Search ............... 330/127, 150, 277, 297, 330/293, 310, 311

[56] References Cited

U.S. PATENT DOCUMENTS

| | | | |
|---|---|---|---|
| 3,622,899 | 11/1971 | Eisenberg | 330/297 X |
| 4,193,040 | 3/1980 | Weissman | 330/293 |
| 4,232,272 | 11/1980 | Fabri | 330/294 |
| 4,429,416 | 1/1984 | Page | 455/211 |
| 4,471,315 | 9/1984 | Tokura et al. | 330/10 |
| 4,524,327 | 6/1985 | Masuda et al. | 330/253 |
| 4,595,884 | 6/1986 | Miller, Jr. | 330/258 |
| 4,843,344 | 6/1989 | Cox | 330/277 X |

Primary Examiner—Steven Mottola
Attorney, Agent, or Firm—Bernard E. Franz; Donald J. Singer

[57] ABSTRACT

This high voltage linear FET amplifier operates at voltage levels of ten's of thousand's of volts with power dissipation capabilities in the kilowatt range. It is a broadband device which features power amplification from DC to frequencies well in excess of 100 KHz. The amplifier uses a unity-gain inverting amplifier as its basic building block. N-number of these building blocks are stacked to accommodate whatever voltage stand-off level is desired. To operate stacked high voltage amplifiers, it is necessary to provide a bias shift (reference) progressively increasing in equal increments from the ground reference stage to the highest voltage level stage while preserving the fidelity of the signal applied to the first stage. This is done by establishing a phantom ground at all amplifiers for each progressive bias level.

5 Claims, 3 Drawing Sheets

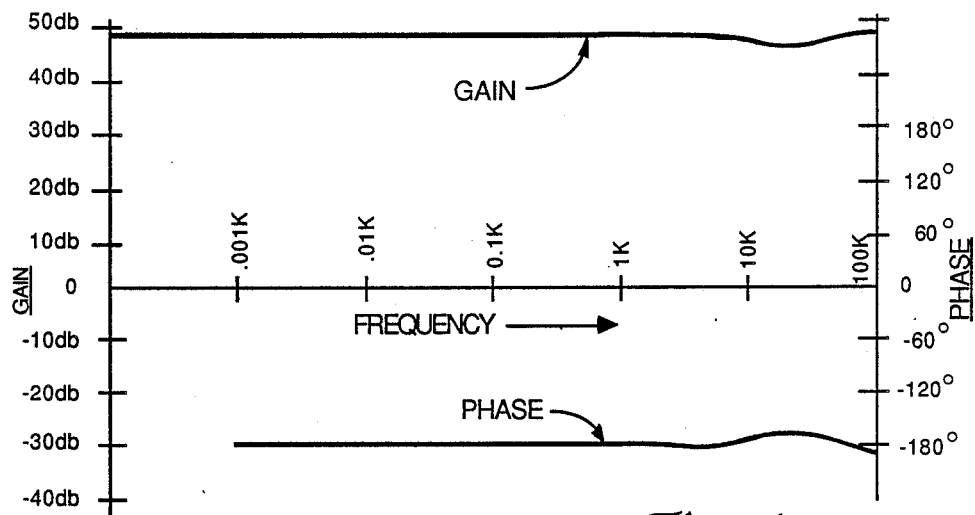
4 ma D. C. Load  *Fig. 4*
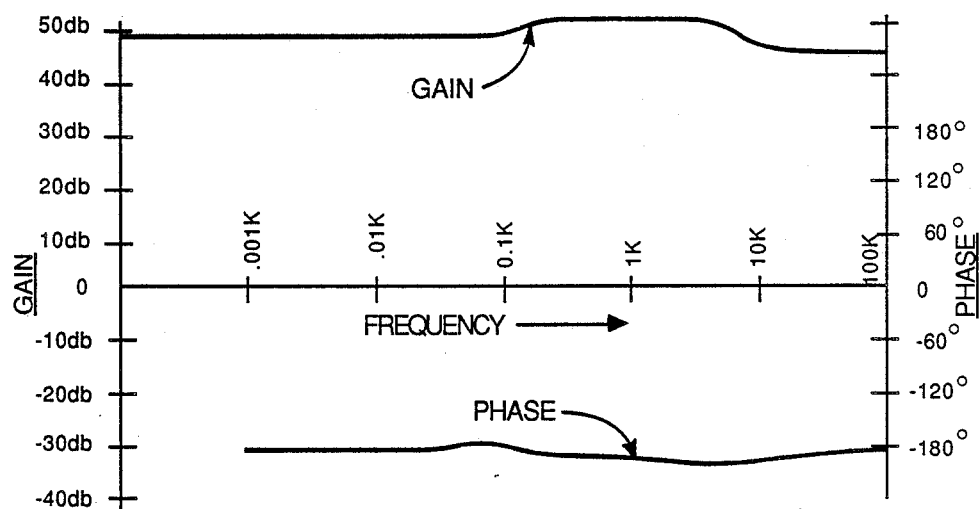
40 ma D. C. Load  *Fig. 5*

DOMINO EFFECT AMPLIFIER

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a high voltage linear FET amplifier which operates at voltage levels of up to ten's of thousand's of volts with power dissipation capabilities in the kilowatt range. It is useful, for example, in radar high voltage transmitter applications.

Previously, high voltage linear amplification was performed with vacuum tubes. Vacuum tubes could only be used for positive plate supply voltages—P-Channel vacuum tubes do not exist. The stand-off voltage of vacuum tubes is limited to about 40 KV. The vacuum tube has thermonic and shot noise not inherent in FET's. The vacuum tube requires auxiliary supplies, filament, screen grid, etc. More important, the vacuum tube generates electrical noise resulting from acoustical vibration.

In the past, there was every justification for using vacuum tubes. Only limited success was achieved by operating direct-coupled series transistors in the linear mode. The complicated biasing networks required for voltage division and signal distribution were cumbersome and impractical. When more than two or three transistors were operated in series, failures would occur because of the dynamic shift between the d-c and signal ground references. D-C coupled operation of cascade bi-polar transistors was never practical because of the base current drive requirements of the transistors. Linear operation of both bi-polar and field effect transistors operated in the linear mode was possible by using r-f carrier modulation or laser modulation to control the inputs of the series connected transistors. These methods proved overly complicated and did not provide an overall generic solution for many applications.

United States patent references of interest include U.S. Pat. No. 4,595,884 to Miller, Jr., which shows in FIG. 1 a bridge amplifier having successive operational amplifier stages 17 and 20 with respective feedback resistors 16 and 19 connected from the amplifier is taken between terminal 9 and ground while the input of the first stage is connected across Wheatstone bridge 51. Similar amplifier stage connections are shown at 150 and 160 in FIG. 4 of Tokura et al U.S. Pat. No. 4,471,315. Fabri, in U.S. Pat. No. 4,232,272, shows a high gain amplifier consisting of a plurality of cascaded stages each comprising an active component, a coupling network and a negative feedback network. In this patent, operating current is fed to the several amplifier stages in counterflow to the incoming signals so that its intensity progressively increases from the first stage to the last, as does the amplification of the signals. Page in U.S. Pat. No. 4,429,416 shows a plurality of differential amplifier stages cascaded in a directly coupled configuration. Masuda et al in U.S. Pat. No. 4,524,327 describe an operational amplifier with three cascade-connected amplifier stages.

SUMMARY OF THE INVENTION

An object of the invention is to provide a generic transistor amplifier for most high voltage linear amplifier requirements.

This invention is directed to a high voltage linear FET amplifier which operates at voltage levels of ten's of thousand's of volts with power dissipation capabilities in the kilowatt range. It is a broadband device which features power amplification from DC to frequencies well in excess of 100 KHz. The amplifier uses a unity-gain inverting amplifier as its basic building block. N-number of these building blocks are stacked to accommodate whatever voltage stand-off level is desired. To operate stacked high voltage amplifiers, it is necessary to provide a bias shift (reference) progressively increasing in equal increments from the ground referenced stage to the highest voltage level stage while preserving the fidelity of the signal applied to the first stage. This is done by establishing a phantom ground at all amplifiers for each progressive bias level.

BRIEF DESCRIPTION OF THE DRAWING

FIGS. 4 and 5 are graphs showing the performance of amplifiers according to the invention.

DETAILED DESCRIPTION

Figure 1:
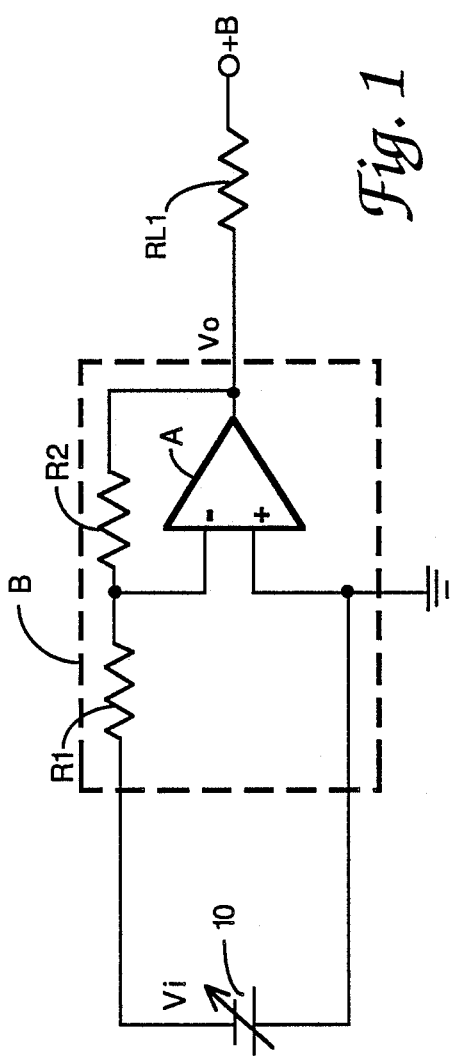
FIG. 1 is a functional block and schematic circuit diagram showing a "domino building block"

A related system called "Domino Effect Shunt Voltage Regulator" by the same applicants is covered by a copending patent application Ser. No. 071,318,210, filed Feb. 28, 1989.

Introduction:

The new High Voltage Linear FET Amplifier, called the "Domino Effect Amplifier", operates at voltage levels of ten's of thousand's of volts with power dissipation capabilities in the kilowatt range. The Domino Effect Amplifier is a broadband device which features power amplification from d-c to frequencies well in excess of 100 KHz. The domino connection permits custom design of high-voltage linear-amplifiers merely by stacking black box sub-assemblies to provide the stand-off voltage desired.

The innovative design provides both N-Channel and P-Channel Amplifiers, which permits operation from either a positive or negative supply source. The device can be used like a single FET and configured as a common source, common drain, or common gate amplifier. As such, it may be applied as either a current source, a pass device or a shunt regulator. Unlike earlier FET cascade amplifiers, the new design guarantees equal voltage division and power sharing among all series connected transistors. Since the design requires no auxiliary power supplies, other than the high voltage source, it can be used as a floating control device at elevated potentials. This is particularly important in radar high voltage transmitter applications.

Previous Methods:

Previously, the functions described above could only be performed with vacuum tubes. Even then, vacuum tubes could only be used for positive plate supply voltages. P-Channel vacuum tubes do not exist. The stand-off voltage of vacuum tubes is limited to about 40 KV. The vacuum tube has thermonic and shot noise not inherent in FET's. The vacuum tube requires auxiliary supplies, filament, screen grid, etc., not needed by the Domino Effect Amplifier. More important, the vacuum tube generates electrical noise resulting from acoustical vibration.

Before the introduction of the Domino Effect Amplifier, there was every justification for using vacuum tubes rather than cascade transistor amplifiers. In the past, only limited success was achieved by operating direct-coupled series transistors in the linear mode. The complicated biasing networks required for voltage division and signal distribution were cumbersome and impractical. When more than two or three transistors were operated in series, failures would occur because of the dynamic shift between the d-c and signal ground references. D-C coupled operation of cascade bi-polar transistors was never practical because of the base current drive requirements of the transistors. Linear operation of both bi-polar and field effect transistors operated in the linear mode was possible by using r-f carrier modulation or laser modulation to control the inputs of the series connected transistors. These methods proved overly complicated and did not provide an overall generic solution for many applications. From all data thus far compiled, the Domino Effect Amplifier meets the goals of a generic amplifier for most high voltage linear amplifier requirements. The Domino Connection is so dominant that series operated FET's appear as a single field effect transistor.

New Method:

The new method of high-voltage amplification uses a unity-gain inverting amplifier as its basic (Domino) building block. This configuration provides maximum frequency response for a given transistor gain-bandwidth product. N-number of these building blocks are stacked to accommodate whatever voltage stand-off level is desired. Other than effects of corona and other high voltage packaging restrictions, there appears to be no practical limit of the voltage level at which the Domino Effect Amplifier can be operated. Because the voltage division between stages is absolute, the power dissipation is shared equally since the load current is common to all stages. The theoretical bandwidth of the composite Domino Effect amplifier is: $1/\sqrt{N} \times$ the BW of a single stage, where N is the number of stages. If, for example, the bandwidth of the unity gain stage is 100 MHz, the composite bandwidth of a 100 stages would be 10 MHz. The composite gain of the amplifier is equal to the number of stages used. For 100 stages, the gain would be 40 db. Unlike vacuum tubes, the Domino Effect Amplifier can be configured either as an N-Channel or P-Channel amplifier which allows for many operating conditions not possible before. The new design appears to be the most significant advancement of high voltage amplifier technology made in the last decade.

Circuit Description:

A typical building block for a Domino Effect Amplifier is shown in FIG. 1. The building block B comprises an amplifying device A having an inverting input (−) connected to the junction of an input or reference resistor R1 and a feedback resistor R2. The resistor R2 has its other end connected to the amplifier device output. The amplifying device A has a non-inverting input (+) shown connected to ground. This forms a three-terminal amplifying unit with the non-inverting input being a common terminal for the input and the output. The input is represented as an adjustable battery 10 having its negative pole connected to the resistor R1 and its positive pole grounded, to provide an input signal $-V_i$. The output of the amplifying device is coupled via a load resistor RL1 to the positive pole of a power supply at potential +B. The output signal from the building block is $V_o$, equal in magnitude and opposite in polarity from the input signal.

FIG. 1 represents the case in which the amplifying device A is an N-channel amplifier. For a P-channel amplifier, the upper input terminal would still be an inverting input and therefore marked minus (−), but the load resistor would be connected to the negative pole −B of the power supply. The input would by $+V_i$, and the output would be $-V_o$.

Figure 2:
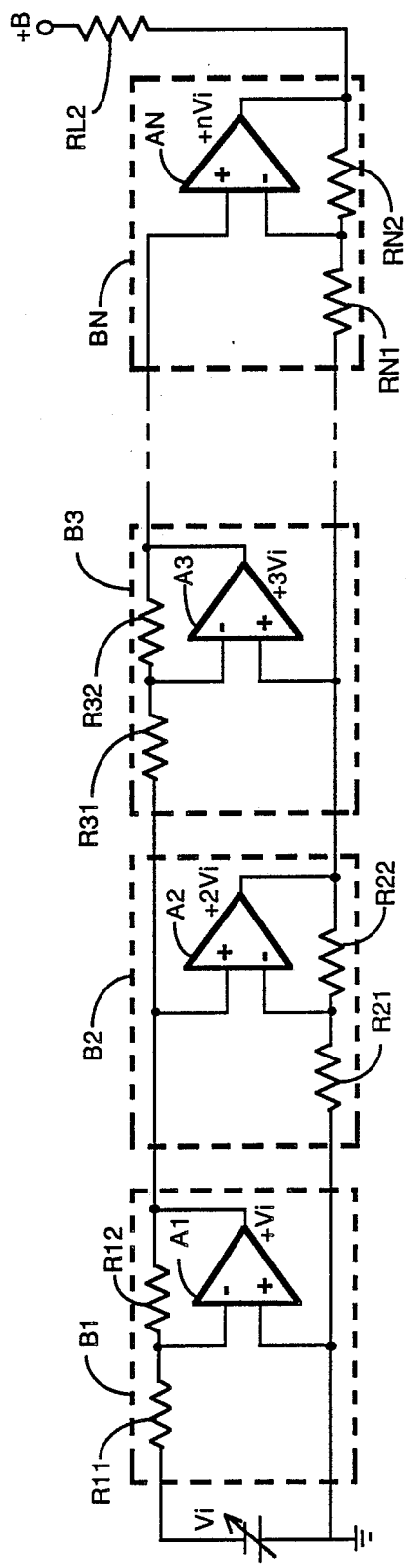
FIG. 2 is a functional block and schematic circuit diagram showing a domino effect amplifier comprising several of the building blocks of FIG. 1 in tandem.

A basic Domino Effect Amplifier for N stages is shown in FIG. 2. It comprises building block stages B1, B2, B3, ... BN, stacked or connected in tandem, with an input $-V_i$ supplied to the input of the first stage, and the output of the last stage BN coupled via a load resistor RL2 to a supply voltage +B. The first stage B1 is connected like the circuit shown in FIG. 1, with the input via resistor R11 to the inverting input (−) of the amplifying device A1, a feedback resistor R12 connected between the inverting input and the output, and the non-inverting input (+) being a common terminal connected to ground. Each succeeding stage has its common terminal at its non-inverting input (+) connected to the output of the amplifying device of the preceding stage; and its inverting input connected to the junction of its input reference resistor and feedback resistor, with the input reference resistor connected to the common terminal of the preceding stage.

Theory of Operation:

As mentioned earlier, the basic building block of the Domino Effect Amplifier is an inverting unity-gain feed-back amplifier whose open-loop gain is high (60 db or more). FIG. 1 shows the circuit configuration of the amplifier. When the open-loop gain of the amplifier is large, the positive output voltage (Vo) will be equal to the negative input voltage (Vi) when resistors R1 and R2 are made equal. Moreover, the output a-c voltage swing will be equal but opposite to that appearing at the input of resistor R1.

The non-inverting input of the amplifier is grounded to establish the signal reference. If the output voltage is doubled (2Vo) by doubling the input voltage (−2Vi), the voltage appearing across the amplifier would also double, since the juncture of resistors R1 and R2 is virtual ground. Other than the shift in reference level, the gain of the amplifier would remain the same.

To operate stacked high voltage amplifiers, it is necessary to provide a bias shift (reference) progressively increasing in equal increments from the ground referenced stage to the highest voltage level stage while preserving the fidelity of the signal applied to the first stage.

The method used in the Domino Effect Amplifier provides the bias shift while maintaining the electrical integrity of the reference stage. This is done by establishing a phantom ground at all amplifiers for each progressive bias level.

FIG. 2 shows the basic Domino Effect Amplifier for N-number of stages. The composite amplifier appears as a three terminal network since all stages derive power from a common B-plus supply and use the first stage for signal drive. The first stage B1 which is referenced to ground is the same as that shown in FIG. 1. Application of the input signal $-V_i$ to the input of resistor R11 causes the output of the stage B1 to go to a level of $+V_i$. The output of stage B1 is applied to the non-inverting input of the second stage B2 and becomes the reference for stage B2. The inverting input to stage B2 is connected to ground via resistor R21. Since the non-inverting input is at the $+V_i$ potential, the output of stage B2 must go to a level of $+2V_i$ to provide loop equilibrium. In this state, the juncture of resistors R21 and R22 appears as a phantom virtual ground at a voltage level of $+V_i$. A similar action occurs in stages B3 and BN; wherein, the non-inverting input of each stage is derived from the output of the proceeding stage and the inverting input is referenced to the non-inverting input of the preceding stage. Given the condition of unity gain, where all reference and feedback resistors are the same value, each stage will contribute a gain of one in the gain summation and a bias elevation of $+V_i$. Thus for three stages, a gain of 3 would be obtained with hold-off voltage of 3 $V_i$.

The dynamic operation is identical to the quiescent case. If an a-c signal is superimposed on the reference input voltage $(-V_i)$, its magnitude would increase progressively by units of one as it ascends from the reference to the highest level stage. Thus, each stage acts like a domino whose dynamic state mirrors that of the proceeding stage. The amplifier is inherently stable, since each stage is an independent closed-loop entity unto itself. Since all bias and signal references are derived from low impedance sources (ground or virtual ground), the only limitation of frequency response is the gain-bandwidth product of the device used.

The first stage of the amplifier chain can be used to provide a gain in excess of one. The only condition is that its maximum output voltage be set so as not to exceed the voltage which the unity-gain follower stages can sustain. For example, if ten 1,000-volt transistors are used to hold off a maximum of 10 KV, the first stage must not exceed 1 KV. Appropriate de-rating must, of course, be applied, depending on the application. Voltage division and power sharing between stages is assured since all stages are essentially anchored by the negative feedback and the inner action of the domino effect within the composite amplifier.

Figure 3:
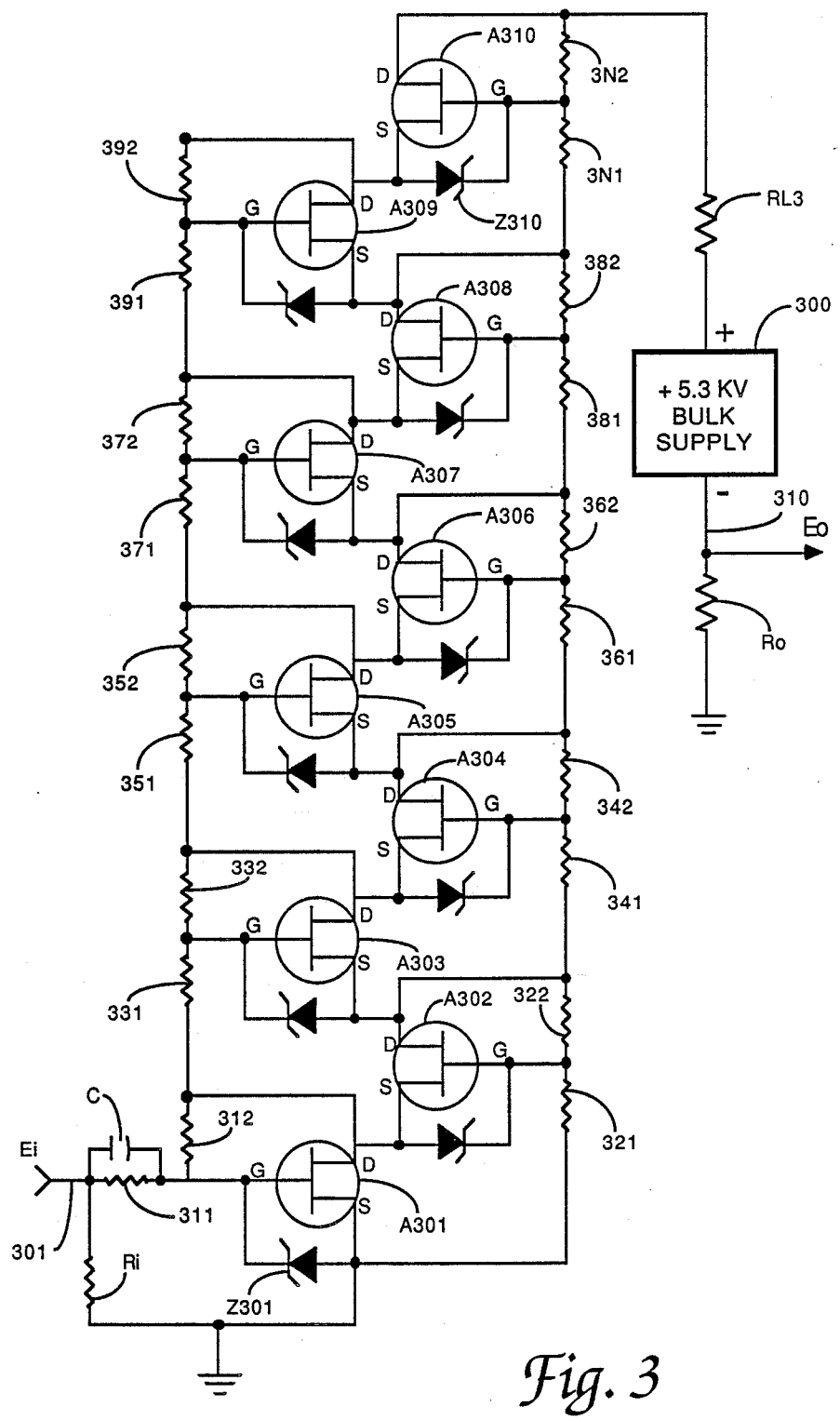
FIG. 3 is a schematic circuit diagram showing a domino effect amplifier comprising several of the building blocks of FIG. 1 in tandem.

Experimental Model:

FIG. 3 shows the schematic diagram of a breadboard circuit used to verify the operation of the Domino Effect Amplifier. An over-drive capacitor C is used on the first stage for frequency enhancement. The circuit uses ten 1,000-volt field effect transistors (FET's) A301-A310 (all N-channel type MTP1N100) connected in the manner described above (Domino Connection). For each transistor, the gate G is the inverting input, the source S is the non-inverting input or common terminal for the stage, and the drain D is the output. Zener diodes Z301-Z310 (type 1N759A) connected between the gate and source of the FET's are necessary to prevent gate to source voltage avalanche when the supply voltage is first applied.

The input Ei to the amplifier is applied at lead 301, with a 100-ohm resistor Ri connected from lead 301 to ground. The output Eo from the amplifier appears at lead 310, with a 1-megohm resistor Ro connected from lead 310 to ground. A 100 ohm limiting resistor RL3 is connected between the output at the drain of the transistor A310 and the positive terminal of a +5.3 kilovolt bulk direct-current power supply 300. The negative terminal of the power supply 300 is connected to the output lead 310.

A 25-kilohm reference resistor 311 for the first stage is connected between the input lead 301 and the gate of transistor A301, in parallel with the 680 picofarad capacitor C. The source of the first-stage transistor is connected to ground. The source of the transistor for each stage after the first is connected to the drain of the transistor of the preceding stage. The nine transistors A302, A303, ... A309, A310 have their gates connected via respective reference resistors 321, 331, ... 391, 3N1 to the sources of the preceding transistors A301, A302, ... A308, A309 respectively. The ten transistors A301, A302, ... A309, A310 have respective feedback resistors 312, 322, ... 392, 3N2 connected between their drains and gates. Each of the reference and feedback resistors has a value of one megohm, except the first reference resistor 311.

A circuit like that of FIG. 3 could be constructed using all P-channel transistors, with the resistor from the last stage being connected to the negative terminal of the power supply 300.

FIGS. 4 and 5 show the open loop Phase and Gain plots of the Domino Effect Amplifier as characterized for a four and forty milliampere d-c load supplied from a 5.3 KV power supply. In both cases, the a-c output peak to peak voltage swing is 3,000 volts. The amplifier is driven with a 5.0 volt rms sine wave drive over a frequency range from one Hertz to 100 KHZ. The gain for both plots is 48 db. For the 40 ma load case, the gain is only 3-4 db down at 100 KHz with no apparent phase deviation, which indicates that the unity gain cross-over frequency is in the MHz range. The experimental results verify the predicted operation of the amplifier.

The frequency response of the amplifier shown in FIG. 3 is restricted by the first stage, which has a gain of 40. The gain was necessary to accommodate the low level input drive from the Venable analyzer used. Since the first stage uses the same FET as the higher level stages, its frequency response is only 1/40 that of the unity gain stages. The overdrive capacitor makes up for part of this restriction. The design can obviously be improved by using higher frequency transistor in the first stage, even if its avalanche voltage is only one half that of the unity gain stages. For a transistor rated for one half the stand-off voltage, it would be necessary for the next higher level stage to have a gain of two. Thereafter all higher level transistor stages must have a gain of unity. In the spirit of the invention, this and other apparent design improvements are considered inclusive.

Applications:

A variety of applications of the Domino Effect Amplifier are apparent. The invention was originally conceived and developed to update high voltage regulator technology as related to microwave tube transmitters. These applications include source, sink, and sink-source regulators for microwave tube body and collector HV power supplies. The amplifier facilitates wave shaping of the transmitted r-f by controlled modulation of the shadow grid, aperture grid, modulation anode, or cathode of the transmit microwave tube. The Domino Effect regulator is ideal for medium power (50-500 watts) transmitter tubes. In this application, self-contained millimeter wave tubes may be used in phased arrays or bottle combiners at MMW transmit frequencies (K-band and up) that solid state arrays cannot accommodate.

The bandwidth provided by the Domino Effect Amplifier provides the means of compensating for voltage droop appearing on transmitter body supply energy storage capacitors. In most pulsed coherent radar transmitters, only a one or two percent voltage droop is permitted on the body supply pulse energy storage capacitor. For long pulses the capacitor size becomes very large. In addition to the large physical size, excessive stored energy is undesirable in that it reduces the longevity of transmitter tubes when internal tube arcs occur. Crow bar circuits are often used to shunt the energy away from the tube during arc conditions.

Even this method is not always effective, but always consumes space. The Domino Effect Amplifier provides a solution for the problems arising from capacitor voltage droop and transmitter tube degradation resulting from spacing. When used as a pass element in the body supply, the amplifier can act as a variable resistor whose insertion loss decreases in accordance with the voltage droop across the storage capacitor. This technique permits a capacitor size reduction of two to ten times while still providing a flat voltage pulse to the body. Since the pass element is in series with the high voltage pulse energy source, it is only necessary to open the pass element when tube arcs occur. This is now possible since the Domino Effect Amplifier can provide stand-off voltages greater than the regulated body voltage. After the arc is quenched and the condition cleared, the pass device would resume its linear function. When the Domino Effect Amplifier is used as a shunt regulator, current to the body is limited by the unregulated supply voltage dropping resistor during tube arcing conditions. The shunt regulator configuration is ideal for C-W transmitters that require a broadband power supply ripple rejection out to the MHz range.

Conclusions:

The "Domino Effect Amplifier" affords the means of providing high performance regulators for high voltage power supplies. A quality transmitter power supply negates the need for feed-forward, phase-compensation, and amplitude-compensation control loops in most radar systems. With the introduction of the Domino Effect P-Channel Amplifier, it is possible to provide a source follower in the microwave tube body supply. This method extends the control loop bandwidth while isolating the third harmonic ripple content (1200 Hz for 400 Hz Prime Power) in three-phase prime power systems. This cannot be done with a vacuum tube regulator.

The simple design of Domino Effect Amplifier (one transistor chip, one diode chip, and two deposited resistors per stage) makes the circuit amenable for power hybrid packaging (PHP's). The PHP could be configured to provide a stand-off voltage of 5 KV per package. A series of such packages could then be connected via two input and output terminals to form whatever operational voltage is desired for a particular application. In this form, the Domino Effect Amplifier becomes an almost generic device, which will reduce production cost and increase system reliability.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. An amplifier comprising a plurality of stages in tandem from a first stage to an Nth stage, each stage being a three-terminal unit having an input terminal, an output terminal and a common terminal, input means coupled between the input and common terminals of the first stage, the output terminal of the Nth stage being coupled via a limiting resistor to a high-voltage power supply;

each stage after the first having its input terminal coupled to the common terminal of the preceding stage, and its common terminal coupled to the output terminal of the preceding stage;

each stage comprising an amplifying device having an inverting input, a non-inverting input and an output, a reference resistor connected between the input terminal of the stage and the inverting input of the amplifying device, a feedback resistor connected between the inverting input and the output of the amplifying device, the non-inverting input of the amplifying device being the common terminal of the stage, and the output of the amplifying device being the output terminal of the stage.

2. An amplifier according to claim 1, wherein for each of said stages at least after the first two stages, the reference and feedback resistors are of equal value to provide a gain of substantially one, with the gain of the amplifier being the sum of the gains of the stages.

3. An amplifier according to claim 2, wherein the amplifying device of each stage is an FET transistor, having a gate electrode used as the inverting input, a source electrode used as the non-inverting input, and a drain electrode used as the output;

and output means coupled between the high-voltage power supply and ground, the common terminal of the first stage being also connected to ground.

4. An amplifier according to claim 3, wherein the FET transistors are N-channel type, the load resistor is connected to a positive pole of the high voltage power supply, the output means is connected to a negative pole of the high voltage power supply, and a negative input bias means is provided with said input means.

5. An amplifier according to claim 3, wherein the FET transistors are P-channel type, the load resistor is connected to a negative pole of the high voltage power supply, the output means is connected to a negative pole of the high voltage power supply, and a positive input bias means is provided with said input means.

* * * * *